US010727228B2

(12) United States Patent
Iwamizu (10) Patent No.: US 10,727,228 B2
(45) Date of Patent: Jul. 28, 2020

(54) STACKED INTEGRATED CIRCUIT

(71) Applicant: FUJI ELECTRIC CO., LTD., Kawasaki (JP)

(72) Inventor: Morio Iwamizu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/233,229

(22) Filed: Dec. 27, 2018

(65) Prior Publication Data

US 2019/0259758 A1    Aug. 22, 2019

(30) Foreign Application Priority Data

Feb. 16, 2018    (JP) .................. 2018-025713

(51) Int. Cl.

| H01L 21/70 | (2006.01) |
|---|---|
| H01L 27/092 | (2006.01) |
| H01L 29/10 | (2006.01) |
| H01L 29/78 | (2006.01) |
| H01L 21/8238 | (2006.01) |
| H01L 29/08 | (2006.01) |
| H01L 29/06 | (2006.01) |
| H01L 29/739 | (2006.01) |

(Continued)

(52) U.S. Cl.

CPC ...... *H01L 27/0922* (2013.01); *H01L 21/8238* (2013.01); *H01L 23/495* (2013.01); *H01L 25/074* (2013.01); *H01L 29/0611* (2013.01); *H01L 29/0865* (2013.01); *H01L 29/0882* (2013.01); *H01L 29/1095* (2013.01); *H01L 29/417* (2013.01); *H01L 29/7393* (2013.01); *H01L 29/7395* (2013.01); *H01L 29/7802* (2013.01)

(58) Field of Classification Search

CPC ............ H01L 27/0922; H01L 29/7395; H01L 23/495; H01L 25/074; H01L 29/417; H01L 29/7393; H01L 29/0611; H01L 29/0865; H01L 29/0882; H01L 21/8238; H01L 29/7802; H01L 29/1095; H01L 27/088; H01L 27/0688; H01L 23/49575; H01L 23/49562

USPC ....................................................... 257/369

See application file for complete search history.

(56) References Cited

U.S. PATENT DOCUMENTS 8,987,777 B2 *   3/2015  Hauenstein ........... H01L 25/071
                                                     257/140
9,219,077 B2 * 12/2015  Yokoyama ............ H01L 23/481
(Continued)

FOREIGN PATENT DOCUMENTS

JP          4178331 B2      11/2008

*Primary Examiner* — Vu A Vu (57) ABSTRACT

A stacked integrated circuit encompasses a lower chip including a lower semiconductor element and an upper surface-electrode electrically connected to an upper main-electrode region of the lower semiconductor element, the upper main-electrode region is located on an upper-surface side of the lower semiconductor element; and an upper chip including an upper semiconductor element and a lower surface-electrode electrically connected to a lower main-electrode region of the upper semiconductor element, the lower main-electrode region is located on a lower-surface side of the upper semiconductor element, the lower surface-electrode is metallurgically in contact with the upper surface-electrode.

13 Claims, 6 Drawing Sheets

(51) Int. Cl.
*H01L 29/417* (2006.01)
*H01L 25/07* (2006.01)
*H01L 23/495* (2006.01)

(56) References Cited

U.S. PATENT DOCUMENTS 9,349,677 B2 * 5/2016 Cho .................... H01L 21/4853
2019/0198488 A1 * 6/2019 Wang .................... H01L 25/167

* cited by examiner

STACKED INTEGRATED CIRCUIT

CROSS REFERENCE TO RELATED APPLICATIONS

This application is based upon and claims the benefit of priority from the prior Japanese Patent Application No. P2018-025713 filed on Feb. 16, 2018, the entire contents of which are incorporated herein by reference.

BACKGROUND OF THE INVENTION

1. Field of the Invention

The present invention relates to a stacked configuration of integrated circuits, and more particularly to a power stacked integrated circuit that can be used for a protection semiconductor switch in an electric circuit.

2. Description of the Related Art

JP 4178331 B proposes to use a bidirectional power switch for a power conversion device or the like. Further, in a drive circuit for automotive electronics, a semiconductor switch is provided on the upstream side of the drive circuit in order to prevent destruction of the electronic control unit (ECU) and the like. When an abnormality occurs in the drive circuit or the like, the semiconductor switch turns off the circuit to protect the ECU. Further, in an electric circuit used for the automobile or the like, since there is a case where a battery is incorrectly connected in the reverse-polarity, a technology for preventing destruction of the ECU or the like is required.

Conventionally, in order to prevent destruction of the electric circuit or the like, a power hybrid integrated circuit in which a discrete n-type metal-insulator-semiconductor (MIS) transistor or the like is bi-directionally arranged as a semiconductor switch is used. In the conventional power hybrid integrated circuit, for example, the source electrodes of the first MIS transistor and the second MIS transistor are connected in the same horizontal level. A body diode (parasitic diode) is connected in anti-parallel to each of the first and second MIS transistors so that each conduction direction is opposite. When such a power hybrid integrated circuit is used as the semiconductor switch, the first and second MIS transistors are brought into a conducting state to turn on electricity in the normal use. In such case, the first MIS transistor is connected in the normal direction, but the second MIS transistor is connected in the reverse direction. The second MIS transistor can conduct by applying a higher gate voltage. In addition, since the body diode of the second MIS transistor is connected in the forward direction, current can also flow through the body diode.

In the power hybrid integrated circuit composing the semiconductor switch or the like, when a large current flows due to an abnormality on the load and the like, the first and second MIS transistors are brought into a turnoff state to prevent destruction of the load and the like. Also, in the case of the reverse-polarity connection of battery, the body diode of the first MIS transistor is connected in the forward direction and the current may flow backward. Therefore, by turning off the second MIS transistor, destruction of the electric circuit and the interconnection and the like connected to the power supply through the power hybrid integrated circuit is prevented.

However, when the semiconductor switch is implemented by a plurality of discrete MIS transistors arranged on a plane so as to provide the power hybrid integrated circuit, the mounting area for the power hybrid integrated circuit becomes larger and it is difficult to miniaturize the electric circuit.

SUMMARY OF THE INVENTION

An aspect of the present invention inheres in a stacked integrated circuit encompassing: (a) a lower chip including a lower semiconductor element and an upper surface-electrode electrically connected to an upper main-electrode region of the lower semiconductor element, the upper main-electrode region is located on an upper-surface side of the lower semiconductor element; and (b) an upper chip including an upper semiconductor element and a lower surface-electrode electrically connected to a lower main-electrode region of the upper semiconductor element, the lower main-electrode region is located on a lower-surface side of the upper semiconductor element, the lower surface-electrode is metallurgically in contact with the upper surface-electrode.

DETAILED DESCRIPTION

Exemplary embodiments of the present invention will be described below with reference to the drawings. In the descriptions of the drawings to be referred, the same or similar elements are indicated by the same or similar reference numerals. It should be understood that the drawings are illustrated schematically, and relationships of thicknesses and planar dimensions, and thickness proportions of the respective devices and elements are not drawn to scale. The specific thicknesses and dimensions should be considered in accordance with the following descriptions. It should also be understood that the respective drawings are illustrated with the dimensional relationships and proportions different from each other.

In the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top". Further, in the Specification and the appended drawings, the superscript "+" or "−" added to the mark "n" or "p" denotes that a semiconductor region has a higher or lower impurity concentration than a region without the superscript "+" or "−" added. It should be noted that semiconductor regions denoted by the same mark, such as "p", do not necessarily have exactly the same impurity concentration.

An "upper main-electrode region" of each semiconductor element used in a stacked integrated circuit (hybrid integrated circuit) denotes one of a source region and a drain region in a field effect transistor (FET) or a static induction transistor (SIT). In an insulated gate bipolar transistor (IGBT), the upper main-electrode region denotes one of an emitter region and a collector region. Further, in a static induction thyristor (SI thyristor) or a gate turn-off (GTO) thyristor, the upper main-electrode region denotes one of an anode region and a cathode region. A "lower main-electrode region" denotes either one of the source region and the drain region which is not the upper main-electrode region in FET or SIT. In the IGBT, the lower main-electrode region denotes one of the emitter region and the collector region which is not the upper main-electrode region. In the SI thyristor or the GTO, the upper main-electrode region denotes either one of the anode region and the cathode region which is not the upper main-electrode region. As above, when the "upper main-electrode region" of each semiconductor element used in the stacked integrated circuit is the source region, the "lower main-electrode region" denotes the drain region. When the "upper main-electrode region" is the emitter region, the "lower main-electrode region" denotes the collector region. When the "upper main-electrode region" is the anode region, the "lower main-electrode region" denotes the cathode region. When the bias relationship is exchanged, in a symmetrically structured FET or the like, the function of the "upper main-electrode region" and the function of the "lower main-electrode region" may be exchanged.

Likewise, in the specification, a "control electrode" denotes an electrode for controlling the main current flow between the upper and lower main-electrode regions. For example, in the FET or the SIT, a gate electrode for controlling a main current flow between the source region and the drain region corresponds. Also in the IGBT, a gate electrode for controlling the main current flow between the emitter region and the collector region corresponds. In the SI thyristor or the GTO, a gate electrode for controlling the main current flow between the anode region and the cathode region corresponds. In the BJT, a base electrode for controlling the main current flowing between the emitter region and the collector region corresponds.

Embodiment

Figure 1:
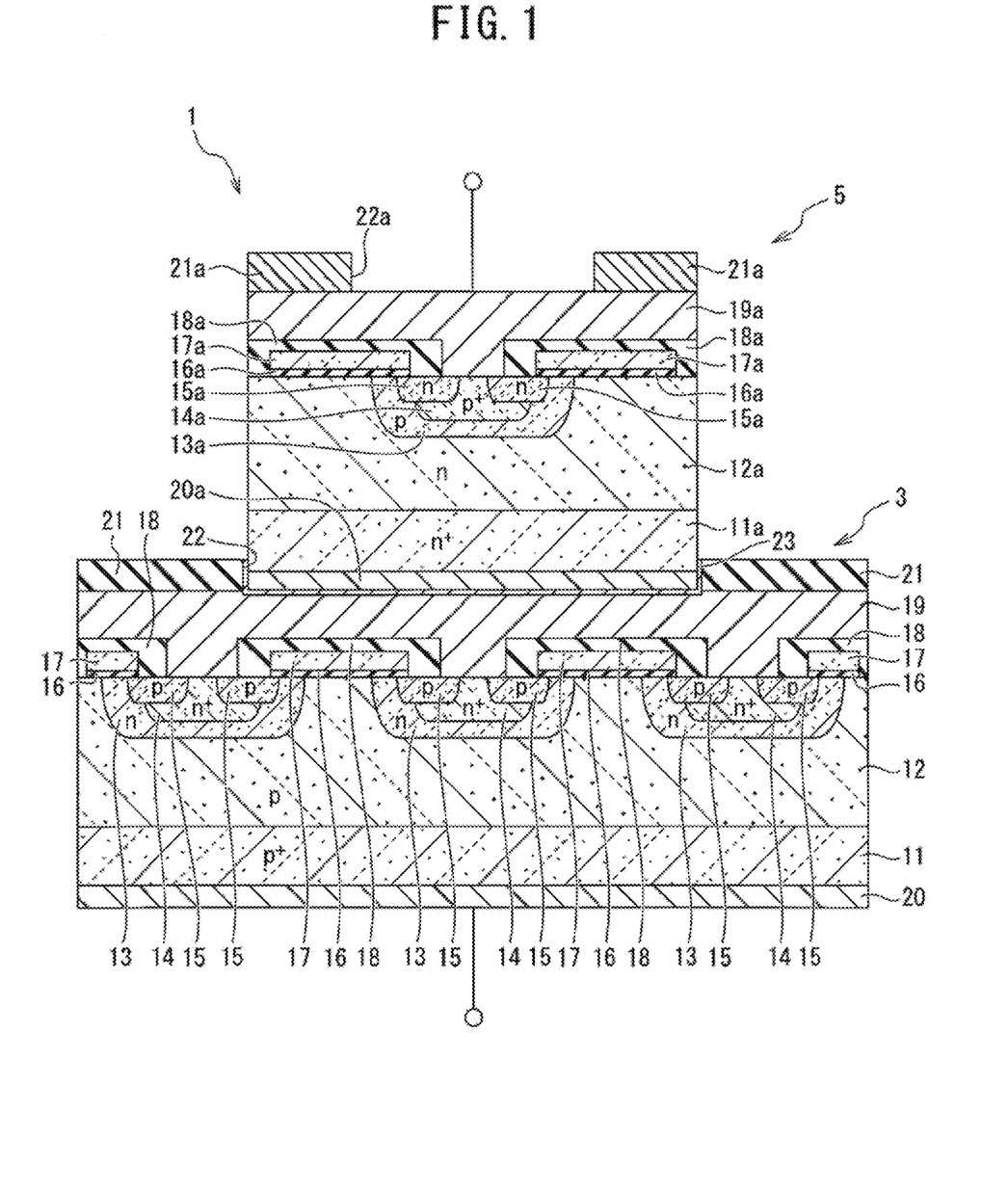
FIG. 1 is a schematic cross-sectional view illustrating an example of a stacked integrated circuit (hybrid integrated circuit) according to an embodiment of the present invention.

As shown in FIG. 1, a stacked integrated circuit 1 according to an embodiment of the present invention is a hybrid integrated circuit, which includes a lower chip 3 in which p-type (first conductivity type) carriers, or holes flow as a main current, and an upper chip 5 in which n-type (second conductivity type) carriers, or electrons flow as a main current. For an upper semiconductor element of the upper chip 5, a semiconductor element having an insulated gate structure, such as a MISFET, a MISSIT, an IGBT or the like, may be desirable. A lower semiconductor element of the lower chip 3 may have a vertical structure or a horizontal structure. As can be understood from the following description, for the upper semiconductor element used for the upper chip 5, a vertical structure in which a main current flows in the depth direction of the upper semiconductor element may be desirable. Hereinafter, description will be given by using a MIS transistor having a planar gate structure using silicon (Si) as the stacked integrated circuit 1. However, it will be obvious to those skilled in the art that the MIS transistor having a trench gate structure exhibit the same effectiveness from understanding the gist of the present invention from the following explanation. Note that the MIS transistor is a concept including MISFET and MISSIT.

The "MIS transistor" denotes a generic term of a more comprehensive insulated gate transistor, which use an insulating film other than the a silicon oxide film ($SiO_2$) as the gate insulating film, in contrast with the MOS transistor implemented by the $SiO_2$ film as the gate insulating film. For the gate insulating film of the MIS transistor, a silicon oxynitride (SiON) film, a strontium oxide (SrO) film, a silicon nitride ($Si_3N_4$) film, or an aluminum oxide ($Al_2O_3$) film can also be used. Alternatively, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, or a bismuth oxide ($Bi_2O_3$) may also be used. Further, a composite film in which several films selected from the above single-layer films are laminated may also be used. For a semiconductor material of the MIS transistor, in addition to silicon (Si), a wide band gap semiconductor material, such as silicon carbide (SiC), gallium nitride (GaN), diamond or aluminum nitride (AlN), which has a forbidden band width wider than Si of 1.1 eV may be used.

The lower chip 3 at least includes the semiconductor element having a p-type first drift region 12, or a first carrier-transport region 12, an n-type first base region 13, a plurality of $n^+$-type first contact regions 14, a plurality of p-type first source regions 15, or first upper main-electrode regions 15, and a plurality of insulated gate electrode structures (16, 17). In the cross-sectional view illustrated in FIG. 1, although the first base region 13 is represented by a divided configuration, these divided regions shall be combined into a single region at a rear portion of the paper. However the first base region 13 may be implemented by discrete sub-regions. The first base region 13 is disposed on the first drift region 12. The first contact regions 14 are disposed respectively on each of the divided portion of the first base region 13. The first source regions 15 are disposed periodically on the first base region 13 and adjacent to the corresponding first contact regions 14. Each of the insulated gate electrode structures (16, 17) includes divided portions of a first gate insulating film 16 and divided portions of a first gate electrode layer 17, or a first control electrode layer 17. Each of the divided portions of the first gate insulating film 16 covers top surfaces of the corresponding portions of first base region 13 and extends to a part of each of the first source regions 15 and a part of the first drift region 12. Each of the divided portions of the first gate electrode layer 17 is disposed on the corresponding portions of the first gate insulating film 16.

A first interlayer insulating film 18 is provided on the first gate electrode layer 17. A source electrode layer 19, or an upper surface-electrode 19 for stacked configuration, is provided so as to be electrically connected to the first source regions 15 and the first contact regions 14 and to cover the first interlayer insulating film 18. A first passivation film 21 using an insulating film, such as a silicon nitride ($Si_3N_4$) film, a polyimide film and the like, is disposed on a top surface of the upper surface-electrode 19. A window 22 is provided in the first passivation film 21 so as to insert the upper chip 5. For the upper surface-electrode 19, aluminum (Al) or aluminum alloy, such as, Al—Si, Al-copper (Cu), Al—Cu—Si or the like, may be used. Further, a nickel (Ni) layer or the like may be disposed on a top surface of the upper surface-electrode 19.

The first drift region 12 is arranged on a top surface of a $p^+$-type first drain region 11, or a lower main-electrode region. A first drain electrode layer 20, or a bottom surface-electrode 20 adapted for external-circuit connection, is disposed so as to be electrically in contact with a bottom surface of the first drain region 11. For the bottom surface-electrode 20, for example, a single layer film made of gold (Au) or a metallic film laminated in the order of titanium (Ti), nickel (Ni) and Au may be used. Further, a metallic plate, such as molybdenum (Mo), tungsten (W) or the like, may be laminated on the metallic film as a lowermost layer.

The upper chip 5 at least includes the semiconductor element having an n-type second drift region 12a, or a second carrier-transport region 12a, a p-type second base region 13a, a $p^+$-type second contact region 14a, an n-type second source region 15a, or a second upper main-electrode region 15a, and an insulated gate electrode structure (16a, 17a). The second base region 13a is disposed on the second drift region 12a. The second contact region 14a is disposed respectively on the second base region 13a. The second source regions 15a are disposed on the second base region 13a and adjacent to the second contact region 14a. The insulated gate electrode structure (16a, 17a) includes a second gate insulating film 16a and a second gate electrode layer 17a, or a second control electrode layer 17a. The second gate insulating film 16a covers a top surface of the second base region 13a and extends to a part of the second source regions 15a and a part of the second drift region 12a. The second gate electrode layer 17a is disposed on the second gate insulating film 16a.

A second interlayer insulating film 18a is provided on the second gate electrode layer 17a. A second source electrode layer 19a, or a top surface-electrode 19a for external circuit connection is provided so as to be electrically connected to the second source regions 15a and the second contact region 14a and to cover the second interlayer insulating film 18a. A second passivation film 21a using an insulating film, such as a $Si_3N_4$ film, a polyimide film and the like, is disposed on a top surface of the top surface-electrode 19a. A window 22a is provided in the second passivation film 21a. For the top surface-electrode 19a, Al or aluminum alloy, such as, Al—Si, Al—Cu, Al—Cu—Si or the like, may be used. Further, a Ni layer or the like may be disposed on a top surface of the top surface-electrode 19a.

The second drift region 12a is disposed on a top surface of a $n^+$-type second drain region 11a—a lower main-electrode region 11a—. The second drain electrode layer 20a, or the lower surface-electrode 20a for stacked configuration, is disposed so as to be electrically in contact with a bottom surface of the second drain region 11a. For the lower surface-electrode 20a, for example, a single layer film made of Au, a metallic film laminated in the order of Ti, Ni, and Au can be used. Further, a metallic plate, such as Mo, W or the like, may be laminated on the metallic film as a lowermost layer.

Although not shown in the cross-sectional view of FIG. 1, a lower gate electrode pad, or the lower control electrode pad, which is electrically connected to the first gate electrode layer 17 of the lower chip 3, is arranged on the first passivation film 21. Similarly, an upper gate electrode pad, or the upper control electrode pad, which is electrically connected to the second gate electrode layer 17a of the upper chip 5, is arranged on the second passivation film 21a.

As shown in FIG. 1, the upper chip 5 is inserted in the window 22 so that the lower surface-electrode 20a of the semiconductor element in the upper chip 5 is metallurgically in contact with the upper surface-electrode 19 of the semiconductor element in the lower chip 3 via a conductive member 23. In more generalized, the lower surface-electrode 20a of the upper semiconductor element is metallurgically in contact with the upper surface-electrode(s) 19 of at least one of the lower semiconductor elements, which implement the lower chip 3. For the conductive member 23 for the metallurgical contact, a solder, a silver paste or the like is used. For example, if a bottom terminal is connected to the bottom surface-electrode 20 of the lower semiconductor element in the lower chip 3, and a top terminal is connected to the top surface-electrode 19a of the upper semiconductor element in the upper chip 5, the stacked integrated circuit 1 illustrated in FIG. 1 can operate as a semiconductor switch. The stacked integrated circuit 1 can be put into a single package by building a chip-on-chip (COC) structure in a configuration such that the upper chip 5, which includes the semiconductor element having a different polarity from the semiconductor element in the lower chip 3, is stacked on the lower chip 3. Further, in the embodiment, because the upper chip 5 is stacked on the lower chip 3, because the mobility of holes is about one-third smaller than the mobility of electrons, and because it is desirable to increase the area of the p-type MIS transistor in order to prevent an increase in on-resistance, it is desirable to provide the lower semiconductor element having the larger area in the lower chip 3 and the upper semiconductor element having the relatively smaller area in the upper chip 5.

Figure 2:
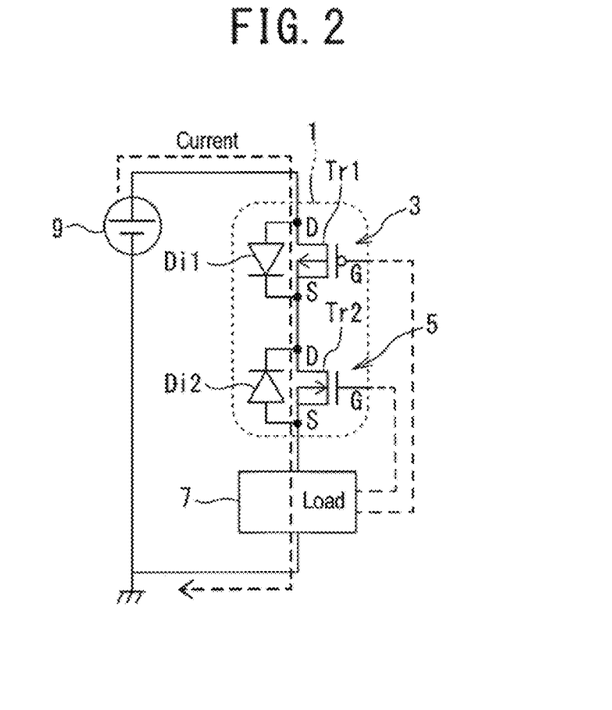
FIG. 2 is a circuit diagram illustrating an example of implementation of the stacked integrated circuit according to the embodiment of the present invention.

FIG. 2 illustrates an example in which the stacked integrated circuit 1 according to the embodiment is normally connected to a power supply unit 9, such as a battery of an automobile or the like, via the bottom surface-electrode 20 and the top surface-electrode 19a. As shown in FIG. 2, an anode and a cathode of a first body diode Di1 are connected in anti-parallel to a drain D and a source S of a first MIS transistor Tr1 of the lower chip 3, respectively. The first body diode Di1 includes the first drain region 11, the first drift region 12, the first base region 13 and the first contact regions 14. Further, a cathode and an anode of a second body diode Di2 are connected in anti-parallel to a drain D and a source S of a second MIS transistor Tr2 of the upper chip 5, respectively. The second body diode Di2 includes the second drain region 11a, the second drift region 12a, the second base region 13a and the second contact region 14a. A gate G of the first MIS transistor Tr1 and a gate G of the second MIS transistor Tr2 are connected to a gate control circuit (not shown) provided in parallel with a load 7.

A positive electrode of the power supply unit 9 is connected to the bottom surface-electrode 20 of the lower chip 3 and the load 7, such as an ECU and the like, is connected to the top surface-electrode 19a of the upper chip 5. During the normal connection, as indicated by the dotted line in FIG. 2, the current flows from the power supply unit 9 to the load 7 through the stacked integrated circuit 1. Here, the first MIS transistor Tr1 is connected in the reverse direction, and the first body diode Di1 is connected in the forward direction. On the other hand, the second MIS transistor Tr2 is connected in the forward direction, and the second body diode Di2 is connected in the reverse direction. Signals for making the MIS transistors Tr1 and Tr2 conductive from the gate control circuit are transmitted to the respective gates G. In the normal connection, as indicated by the dotted line in FIG. 2, the current flows from the power supply unit 9 through the first MIS transistor Tr1, the first body diode Di1 and the second MIS transistor Tr2 to the load 7. Although the first MIS transistor Tr1 is connected in the reverse direction, it is possible to be brought into a conduction state by raising the gate voltage.

When an abnormality occurs in the load 7 and a large current flows, signals for turning off the first MIS transistor Tr1, the second MIS transistor Tr2 are transmitted from the gate control circuit to the respective gates G. Although the first body diode Di1 is in a conducting state, since the second MIS transistor Tr2 is in the turnoff state, the current can be turned off.

Figure 3:
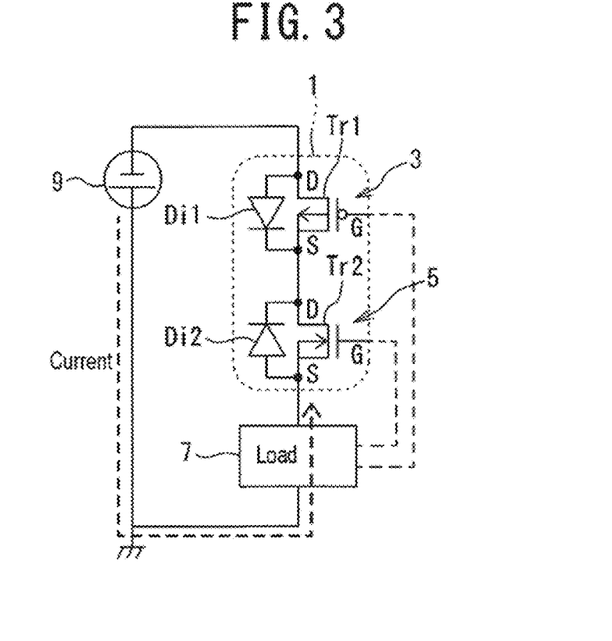
FIG. 3 is a circuit diagram illustrating another example of implementation of the stacked integrated circuit according to the embodiment of the present invention.

FIG. 3 illustrates an example in which the stacked integrated circuit 1 according to the embodiment is reverse-connected to a power supply unit 9 of an automobile or the like. As shown in FIG. 3, in the case of a reverse-polarity connection to the power supply unit 9, the first MIS transistor Tr1 is connected in the normal direction and the first body diode Di1 is connected in the reverse direction. The second MIS transistor Tr2 is connected in the reverse direction, and the second body diode Di2 is connected in the forward direction. In such case, the gate control circuit turns off the first MIS transistor Tr1, the second MIS transistor Tr2. Although it is possible for the second body diode Di2 to conduct a current in the forward connection, no current flows because the first MIS transistor Tr1, the second MIS transistor Tr2 and the first body diode Di1 are turned off.

When the power supply unit 9 is normally connected to the stacked integrated circuit 1, the first body diode Di1 of the upper chip 5 is connected in the reverse direction, and it is necessary for the upper chip 5 to increase a reverse breakdown voltage in consideration of dump surge and the like, which is peculiar to the automobile. For example, if the voltage of the power supply unit 9 is about 24 volts, the upper chip 5 needs the reverse breakdown voltage of 40 volts or more. On the other hand, since the lower chip 3 has only to shut off the current when the power supply unit 9 is connected in reverse, the reverse breakdown voltage may be about 30 volts which is slightly higher than the voltage of the power supply unit 9. Therefore, it is desirable that the reverse breakdown voltage of the upper chip 5 is set to be equal to or higher than the reverse breakdown voltage of the lower chip 3. Note that, by decreasing the reverse breakdown voltage of the semiconductor chip, it is possible to decrease the on-resistance. For example, if the reverse breakdown voltage is decreased from about 40 volts to about 30 volts, a chip size can be reduced by about 10 percent, and a manufacturing cost can be reduced. In addition, the stacked integrated circuit 1 according to the embodiment can be used as a nonpolar bidirectional semiconductor switch unless there is a problem in the reverse breakdown voltage.

Figure 4:
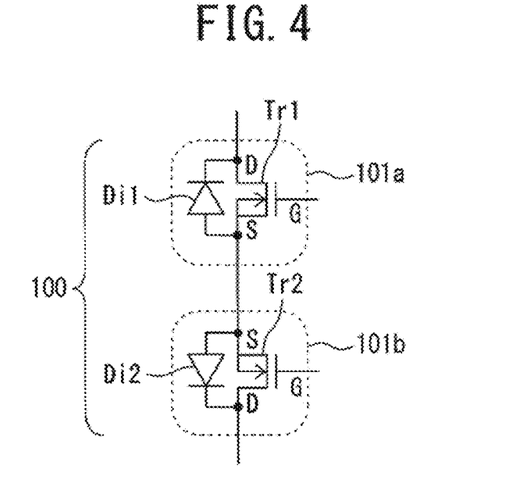
FIG. 4 is a circuit diagram illustrating an example of implementation of a planar hybrid integrated circuit according to a comparative example.

As described above, in the stacked integrated circuit 1 according to the embodiment, the lower chip 3 and the upper chip 5 are stacked to be put into the single package. As illustrated in FIG. 4, a conventional hybrid integrated circuit 100 uses a semiconductor chip 101a and a semiconductor chip 101b in which respective discrete MIS transistors are individually packaged. Therefore, the stacked integrated circuit 1 according to the embodiment can reduce the mounting area to half or less compared with the hybrid integrated circuit 100 in which two conventional semiconductor chips 101a, 101b are arranged in a plane. As illustrated in FIG. 4, if the semiconductor chips 101a, 101b are stacked by joining the sources S to each other, a gate electrode pad of the upper chip, for example, the semiconductor chip 101b has to be disposed facing downward. In the case where the drain D is joined to each other, the gate electrode pads of the semiconductor chip 101a and the semiconductor chip 101b have to be exposed on the top surface and the bottom surface of the stacked structure, respectively. Thus, interconnections to the gates G of the semiconductor chip 101a and the semiconductor chip 101b may be difficult.

Next, a method of manufacturing the stacked integrated circuit 1 according to the embodiment of the present invention will be described with reference to FIGS. 5 to 9. The manufacturing method of the stacked integrated circuit 1 described below is merely an example, and it should also be understood that the stacked integrated circuit 1 according to the embodiment may be achieved by various other manufacturing methods including modifications as long as the gist described in the claims is included.

Figure 5:
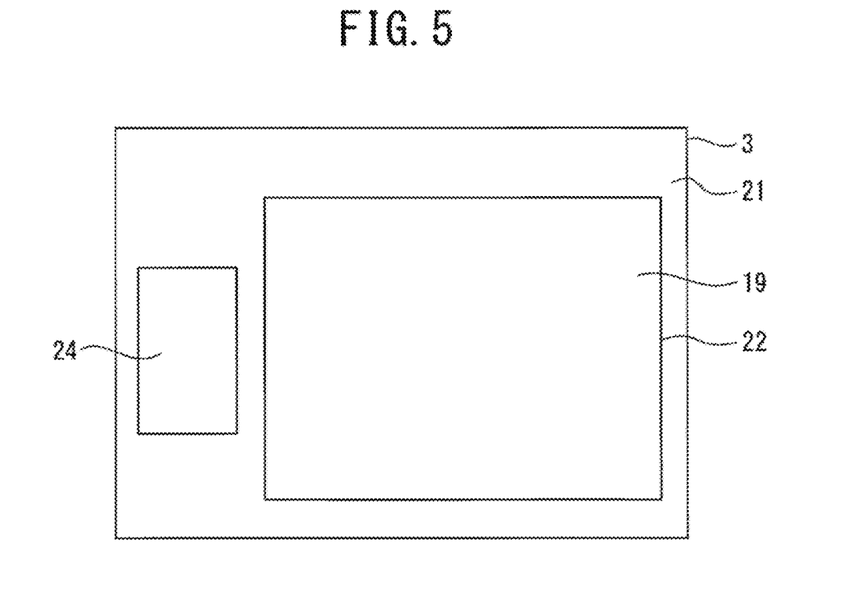
FIG. 5 is a top view illustrating an example of a process in a method for manufacturing the stacked integrated circuit according to the embodiment of the present invention.

As illustrated in FIG. 5, a semiconductor chip 3, or the lower chip 3 having the p-type MIS transistor has been prepared. On the top surface of the lower chip 3, an upper surface-electrode 19 is exposed in a window 22 which is provided in a first passivation film 21. Furthermore, a gate electrode pad 24, which is arranged on the first passivation film 21, is also exposed. The gate electrode pad 24 is electrically connected to the first gate electrode layer 17 via the first interlayer insulating film 18 as illustrated in FIG. 1.

Figure 6:
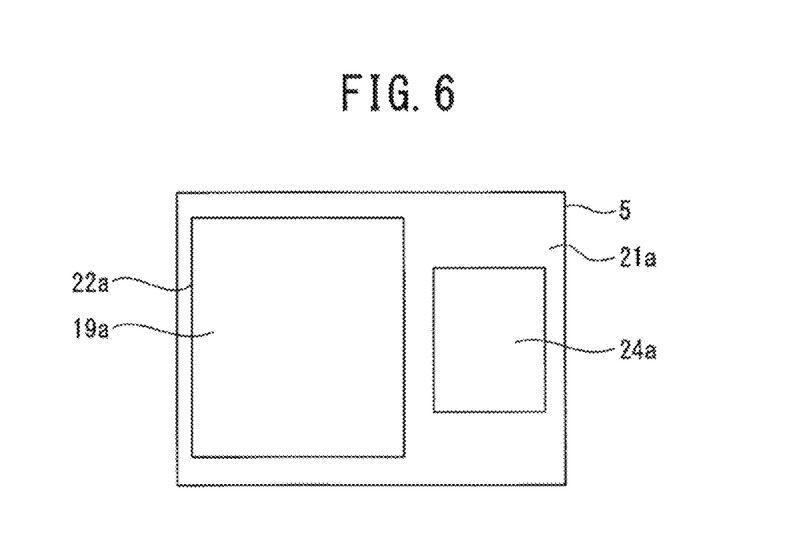
FIG. 6 is a top view illustrating an example of a process subsequent to FIG. 5 in the method for manufacturing the stacked integrated circuit according to the embodiment of the present invention.

As illustrated in FIG. 6, a semiconductor chip 5, or the upper chip 5 having the n-type MIS transistor, has been prepared. On the top surface of the semiconductor chip 5, a top surface-electrode 19a is exposed in a window 22a provided in a second passivation film 21a. Furthermore, a gate electrode pad 24a, which is arranged on the second passivation film 21a, is also exposed. The gate electrode pad 24a is electrically connected to the second gate electrode layer 17a via the second interlayer insulating film 18a as illustrated in FIG. 1. The window 22 provided in the lower chip 3 has a dimension, which can facilitate the insertion of the upper chip 5 in the window 22.

Figure 7:
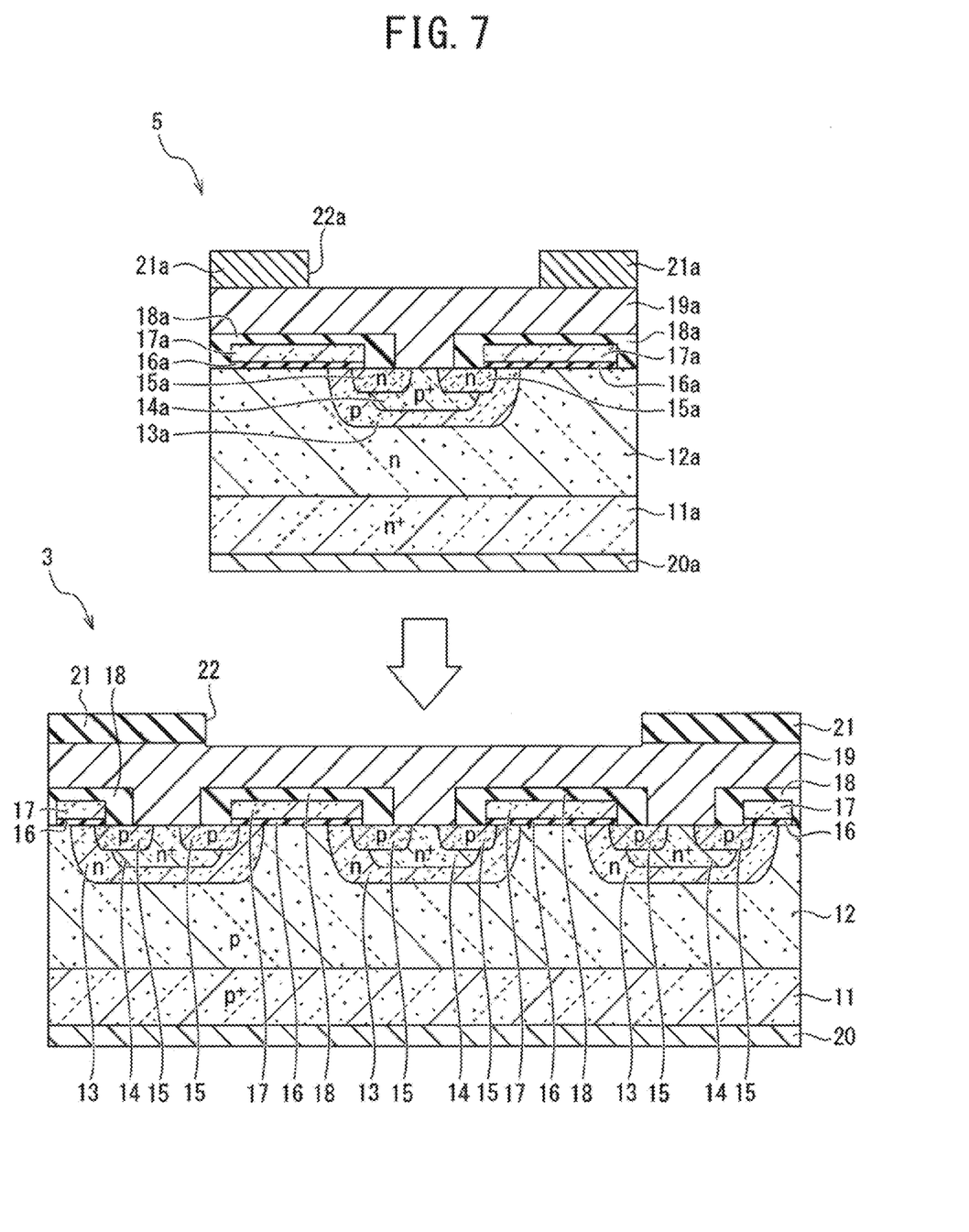
FIG. 7 is a cross-sectional view illustrating an example of a process subsequent to FIG. 6 in the method for manufacturing the stacked integrated circuit according to the embodiment of the present invention.

As illustrated in FIG. 7, while inserting the upper chip 5 in the opening 22 of the lower chip 3 by a soldering technique, such as a reflow method or the like, the upper surface-electrode 19 and the bottom surface-electrode 20a are metallurgically connected. In order to facilitate soldering, a metallic film, such as Ni or the like, is formed on the surface of the upper surface-electrode 19 of the lower chip 3 by a plating technique or the like.

Further, as the lower surface-electrode 20a of the upper chip 5, it is preferable to use a multilayered film of Ti/Ni/Au, the order of the lamination of Ti, Ni and Au films may be defined from the second drain region 11a. In addition, a conductive paste such as a silver paste may be used.

Figure 8:
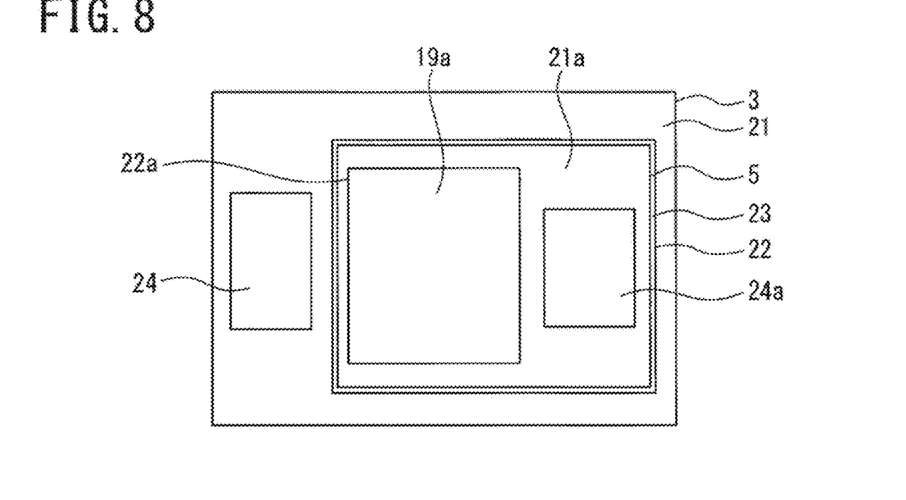
FIG. 8 is a top view illustrating an example of a process subsequent to FIG. 7 in the method for manufacturing the stacked integrated circuit according to the embodiment of the present invention.

Thus, as illustrated in FIG. 8, the upper chip 5 is embedded into the opening 22 of the lower chip 3. The upper surface-electrode 19 and the lower surface-electrode 20a, both are illustrated in FIG. 7, are metallurgically connected by the conductive member 23 illustrated in FIG. 8. On the top surface of the stacked chip (3, 5), the gate electrode pad 24 of the lower chip 3, the top surface-electrode 19a and the gate electrode pad 24a of the of the upper chip 5 are exposed such that each of the longer sides of the gate electrode pad 24, the top surface-electrode 19a and the gate electrode pad 24a are arranged in parallel.

Figure 9:
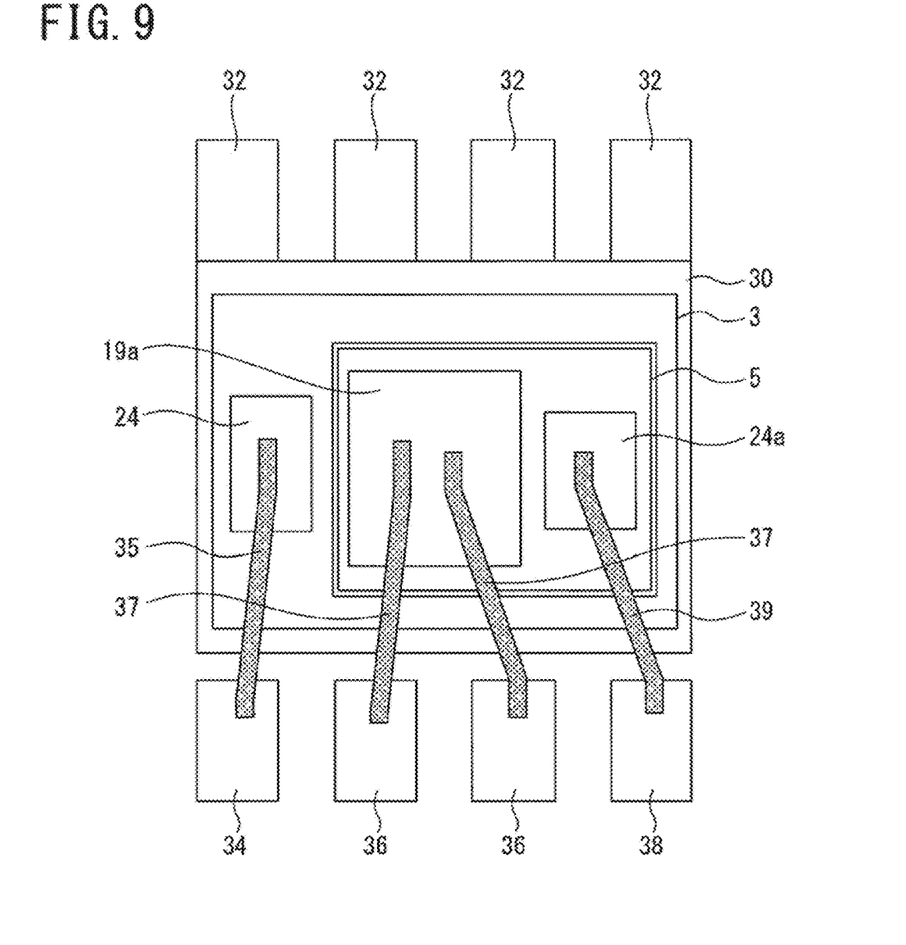
FIG. 9 is a top view illustrating an example of a process subsequent to FIG. 8 in the method for manufacturing the stacked integrated circuit according to the embodiment of the present invention.

Thereafter, the bottom surface-electrode 20 of the stacked chip (3, 5), which is illustrated in FIGS. 1 and 7, is connected to a lead frame 30 by a die bonding scheme or the like as illustrated in FIG. 9. The bottom surface-electrode 20 is electrically connected to an external terminal 32 of the lead frame 30. The gate electrode pad 24, the top surface-electrode 19a and the gate electrode pad 24a are electrically connected to external terminals 34, 36, 38 by bonding wires 35, 37, 39, respectively. As mentioned above, the stacked chip (3, 5) is attached to the lead frame 30 and by resin-mold, the stacked integrated circuit 1 according to the embodiment is completed.

In the embodiment, as illustrated in FIG. 9, it is possible to align each of longer sides of the gate electrode pad 24, the top surface-electrode 19a and the gate electrode pad 24a in parallel. Because the orientations of longer sides are aligned, wire bonding is simplified, and interconnection of bonding wires is facilitated.

OTHER EMBODIMENTS

While the present invention has been described above by reference to the embodiment, it should be understood that the present invention is not intended to be limited to the descriptions of the specification and the drawings implementing part of this disclosure. Various alternative embodiments, examples, and technical applications will be apparent to those skilled in the art according to this disclosure.

For example, in FIG. 1, the structure of the lower chip 3, which includes the p-type first drift region 12, or the p-type first carrier-transport region 12 and the p$^+$-type first drain region 11, has been illustrated as an example. Instead of the first drain region 11, a p$^+$-type buried layer which is epitaxially grown on an n-type support substrate—semiconductor wafer—is used and a p-type first drift region 12 is formed on the p$^+$-type buried layer by continuous epitaxial growth so as to build a lower chip with a triple-layer structure. In the case of the lower chip having the triple-layer structure using the p$^+$-type buried layer instead of the first drain region 11, a sinker region reaching the p$^+$-type buried layer from the top surface of the first drift region 12 may be provided.

Alternatively, a deep trench, or a through hole reaching the p$^+$-type buried layer may be formed by ion milling or reactive ion etching (RIE), and p$^+$-type impurities may be diffused into the side wall of the through hole so as to implement a conductive path to the p$^+$-type buried layer. Furthermore, a doped polysilicon (DOPOS) or a refractory metal, such as tungsten (W), titanium (Ti) or the like, may be buried in the through hole to form a structure of a through-silicon via (TSV) so that the TSV can serve as a drain-voltage supply member. That is, the drain electrode layer may be connected from the upper surface side of the first drift region 12 to the p$^+$-type buried epitaxial layer so that the p$^+$-type buried epitaxial layer can serve as the drain region via the sinker region or TSV. In such case, the drain electrode wiring is provided on the upper surface side of the first drift region 12. In the case of using the buried epitaxial layer instead of the first drain region 11, the support substrate on the back side may be an insulator substrate using a silicon-on-insulator (SOI) structure.

In FIG. 1, the structure of a discrete element, in which a single multi-channel MISFET is merged in the lower chip 3, is merely exemplified as an example. The lower chip 3 may have a structure in which a plurality of semiconductor elements is monolithically integrated. As described above, it should be noted that the present invention includes various embodiments which are not disclosed herein. Therefore, the scope of the present invention is defined only by the technical features specifying the present invention, which are prescribed by claims, the words and terms in the claims shall be reasonably construed from the subject matters recited in the present Specification.

What is claimed is:

1. A stacked integrated circuit, comprising:
    a lower chip including:
        a lower semiconductor element,
        a first lower surface drain electrode electrically connected to a bottom surface of a lower main-electrode region which is provided on a lower-surface side of the lower semiconductor element, and
        a first upper surface source electrode electrically connected to an upper main-electrode region which is provided on an upper-surface side of the lower semiconductor element; and
    an upper chip stacked on the lower chip, including:
        an upper semiconductor element having a smaller area than the lower semiconductor element,
        a second upper surface source electrode electrically connected to an upper main-electrode region which is provided on an upper-surface side of the upper semiconductor element, and
        a second lower surface drain electrode electrically connected to a bottom surface of a lower main-electrode region which is provided on a lower-surface side of the upper semiconductor element, the second lower surface drain electrode being metallurgically in contact with the first upper surface source electrode.

2. The stacked integrated circuit of claim 1, wherein the lower semiconductor element uses carriers of a first conductivity type as majority carriers implementing a main current in the lower semiconductor element, and the upper semiconductor element uses carriers of a second conductivity type as majority carriers implementing a main current in the upper semiconductor element.

3. The stacked integrated circuit of claim 2, wherein the carriers of the first conductivity type are holes.

4. The stacked integrated circuit of claim 1, wherein the lower semiconductor element further includes:
    a first carrier-transport region of the first conductivity type;
    a first base region of the second conductivity type provided on the first carrier-transport region; and
    a first contact region of the second conductivity type provided on top of the first base region,
    wherein
    the upper main-electrode region of the lower semiconductor element is a semiconductor region of the first conductivity type provided on top of the first base region and adjacent to the first contact region, and
    the first lower surface drain electrode is configured to be connected to an external-circuit, and provided on a lower surface side of the first carrier-transport region.

5. The stacked integrated circuit of claim 1, wherein the lower semiconductor element is a p-type metal-insulator-semiconductor transistor and the upper semiconductor element is an n-type metal-insulator-semiconductor transistor.

6. The stacked integrated circuit of claim 1, wherein a reverse breakdown voltage of the upper semiconductor element is higher than that of the lower semiconductor element.

7. The stacked integrated circuit of claim 1, wherein the second lower surface drain electrode is connected to the first upper surface source electrode by a conductive member.

8. The stacked integrated circuit of claim 1, wherein a passivation film is provided on a top surface of the lower chip and a window is provided in the passivation film in which the upper chip is stacked on the lower chip.

9. The stacked integrated circuit of claim 1, wherein
a first control electrode pad is electrically connected to a control electrode layer of the lower semiconductor element,
a second control electrode pad is electrically connected to a control electrode layer of the upper semiconductor element,
the second upper surface source electrode is exposed to an outside of the stacked integrated circuit, and
longer sides of the first control electrode pad and the second control electrode pad are arranged in parallel with each other.

10. The stacked integrated circuit of claim 1, wherein
the lower main-electrode region of the lower semiconductor element is a first drain region, and
the lower main-electrode region of the upper semiconductor element is a second drain region.

11. The stacked integrated circuit of claim 1, wherein
the second lower surface drain electrode is connected to the first upper surface source electrode by a conductive member,
a width of the second lower surface drain electrode in a direction perpendicular to a depth direction of the stacked integrated circuit is less than a width of the first upper surface source electrode in the direction perpendicular to the depth direction of the stacked integrated circuit, and
a width of the conductive member in the direction perpendicular to the depth direction of the stacked integrated circuit is less than the width of the first upper surface source electrode in the direction perpendicular to the depth direction of the stacked integrated circuit.

12. A stacked integrated circuit, comprising:
a lower chip including a lower semiconductor element and an upper surface-electrode electrically connected to an upper main-electrode region of the lower semiconductor element, the upper main-electrode region is located on an upper-surface side of the lower semiconductor element, the lower semiconductor element further including:
a first carrier-transport region of the first conductivity type,
a bottom surface-electrode configured to be connected to an external-circuit, provided on a lower surface side of the first carrier-transport region,
a first base region of the second conductivity type provided on the first carrier-transport region,
a first contact region of the second conductivity type provided on top of the first base region, and
the upper main-electrode region of the lower semiconductor element is a semiconductor region of the first conductivity type provided on top of the first base region and adjacent to the first contact region; and
an upper chip including an upper semiconductor element and a lower surface-electrode electrically connected to a lower main-electrode region of the upper semiconductor element, the lower main-electrode region is located on a lower-surface side of the upper semiconductor element, the lower surface-electrode is metallurgically in contact with the upper surface-electrode, the upper semiconductor element further including:
a second carrier-transport region of the second conductivity type,
a second base region of the first conductivity type provided on the second carrier-transport region,
a second contact region of the first conductivity type provided on the second base region,
a second upper main-electrode region of the second conductivity type provided on top of the second base region and adjacent to the second contact region,
a top surface-electrode configured to be connected to the external circuit, electrically connected to the second upper main-electrode region, and
the lower main-electrode region of the upper semiconductor element is a semiconductor region provided on a lower surface side of the second carrier-transport region.

13. A stacked integrated circuit, comprising:
a lower chip including a lower semiconductor element and an upper surface-electrode electrically connected to an upper main-electrode region of the lower semiconductor element, the upper main-electrode region is located on an upper-surface side of the lower semiconductor element; and
an upper chip including an upper semiconductor element and a lower surface-electrode electrically connected to a lower main-electrode region of the upper semiconductor element, the lower main-electrode region is located on a lower-surface side of the upper semiconductor element, the lower surface-electrode is metallurgically in contact with the upper surface-electrode, wherein
the lower chip includes a first gate electrode pad electrically connected to a first gate electrode layer of the lower semiconductor element, and externally exposed in a plan view of the stacked integrated circuit at an interior portion of the lower chip,
the upper chip includes a second gate electrode pad electrically connected to a second gate electrode layer of the upper semiconductor element, and externally exposed in a plan view of the stacked integrated circuit at an interior portion of the upper chip, and
longer sides of the first gate electrode pad and the second gate electrode pad are in parallel with each other.

* * * * *